(12) United States Patent
Tihanyi et al.

(10) Patent No.: US 6,281,119 B1
(45) Date of Patent: Aug. 28, 2001

(54) METHOD FOR MAKING CONTACT WITH A SEMICONDUCTOR LAYER AND SEMICONDUCTOR STRUCTURE HAVING A PLURALITY OF LAYERS

(75) Inventors: Jenoe Tihanyi, Kirchheim; Wolfgang Werner, München, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/484,780

(22) Filed: Jan. 18, 2000

Related U.S. Application Data

(63) Continuation of application No. PCT/DE98/01987, filed on Jul. 15, 1998.

(30) Foreign Application Priority Data

Jul. 15, 1997 (DE) .............................................. 197 30 327

(51) Int. Cl.[7] .................................................. H01L 21/44
(52) U.S. Cl. .......................... 438/657; 438/400; 438/410; 438/510; 437/60; 437/186; 437/189; 437/192; 357/23; 357/71
(58) Field of Search ...................................... 438/657, 400, 438/410, 510; 437/186, 189, 60, 192; 357/71, 23

(56) References Cited

U.S. PATENT DOCUMENTS

| | | | |
|---|---|---|---|
| 4,837,051 | 6/1989 | Farb et al. | 427/97 |
| 5,057,899 | 10/1991 | Samata et al. | 357/68 |
| 5,070,377 | 12/1991 | Harada | 357/23.4 |
| 5,091,768 | 2/1992 | Yamazaki | 357/71 |
| 5,108,945 | 4/1992 | Matthews | 437/60 |
| 5,244,835 | 9/1993 | Hachiya | 437/186 |
| 5,387,550 | 2/1995 | Cheffings et al. | 437/189 |
| 5,420,072 | 5/1995 | Fiordalice et al. | 437/192 |
| 5,424,247 | * 6/1995 | Sato | 437/195 |
| 5,427,980 | * 6/1995 | Kim | 437/190 |
| 5,444,021 | * 8/1995 | Chung et al. | 437/195 |
| 5,464,793 | * 11/1995 | Roehl | 437/186 |
| 5,545,581 | 8/1996 | Armacost et al. | 437/52 |

FOREIGN PATENT DOCUMENTS

0774777A1    5/1997   (EP) .

OTHER PUBLICATIONS

Japanese Patent Abstract No. 04155823 (Seiji), dated May 28, 1992.
Japanese Patent Abstract No. 63128626 (Yukinobu), dated Jun. 1, 1988.

* cited by examiner

Primary Examiner—Vu A. Le
Assistant Examiner—Pho Luu
(74) Attorney, Agent, or Firm—Herbert L. Lerner; Laurence A. Greenberg; Werner H. Stemer

(57) ABSTRACT

A method for making contact with a covered semiconductor layer through a contact hole, includes producing a contact hole in an insulator layer for making contact with at least one covered semiconductor layer. A heavily doped polysilicon layer is produced on the surface of the insulator layer and the contact hole is at least partially filled with heavily doped polysilicon. A metal layer is applied on the heavily doped polysilicon layer for establishing an ohmic connection to the outside. A semiconductor component fabricated according to the method is also provided.

11 Claims, 1 Drawing Sheet

METHOD FOR MAKING CONTACT WITH A SEMICONDUCTOR LAYER AND SEMICONDUCTOR STRUCTURE HAVING A PLURALITY OF LAYERS

CROSS-REFERENCE TO RELATED APPLICATION

This application is a continuation of copending International Application No. PCT/DE98/01987, filed Jul. 15, 1998, which designated the United States.

BACKGROUND OF THE INVENTION

Field of the Invention

The invention relates to a method for making contact with semiconductor components as well as to a corresponding semiconductor component fabricated by the method according to the invention.

During the production of semiconductor components, individual cells of the semiconductor component are connected to one another and to terminals leading to the outside. That is usually accomplished through the use of one or more interconnect planes made of aluminum. In order to connect the interconnect planes to switching elements in the semiconductor, contact holes are etched through the insulator layers on the actual semiconductor substrate to establish electrical contact between the interconnect plane and the elements of the cell.

During the fabrication of contact holes, it is necessary to take account of certain requirements of the subsequent contact-making. During the fabrication of a contact hole with a rectangular cross-sectional profile, problems having to do with edge coverage frequently arise in the production of an Al layer for the contact-making. The Al layers often have constrictions at the edges. At those points, there may then be an intensified transport of material in the conductor and consequently interconnect breaks, due to the increased current density.

A contact hole having a rectangular cross-sectional profile and a contact hole with beveled edges are discussed in detail below with reference to FIGS. 2 and 3. However, the prior art methods do not permit high contact hole density to be achieved on the semiconductor in conjunction with high reliability of electrical contacts and the prior art semiconductor components do not have reliable electrical contacts.

SUMMARY OF THE INVENTION

It is accordingly an object of the invention to provide a method for making contact with a semiconductor layer and a semiconductor structure having a plurality of layers, which overcome the hereinafore-mentioned disadvantages of the heretofore-known methods and devices of this general type, in which the method enables a higher contact hole density to be achieved on the semiconductor in conjunction with increased reliability of electrical contacts and in which the semiconductor component has more reliable electrical contacts.

With the foregoing and other objects in view there is provided, in accordance with the invention, a method for making contact with at least one covered semiconductor layer through a contact hole, which comprises providing the at least one semiconductor layer; covering the at least one semiconductor layer with an insulator layer having a surface; producing the contact hole in the insulator layer for making contact with the at least one covered semiconductor layer; producing a heavily doped polysilicon layer on the surface of the insulator layer while at least partially filling the contact hole with heavily doped polysilicon; and applying a metal layer on the heavily doped polysilicon layer for establishing an ohmic connection to the outside.

In accordance with another mode of the invention, the surface of the polysilicon layer is planarized prior to the application of the metal layer, with the result that the surface of the polysilicon is essentially planar.

In accordance with a further mode of the invention, in order to ensure that better simultaneous contact is made with a plurality of semiconductor layers lying one above the other by a polysilicon layer, a conductor layer is applied on the surface of the insulator layer and the surface of the contact hole prior to the production of the polysilicon layer.

With the objects of the invention in view, there is also provided a semiconductor structure having a plurality of layers, comprising at least one semiconductor layer for electrical connection to the outside; an insulator layer disposed above the at least one semiconductor layer, the insulator layer having at least one contact hole formed therein for exposing the at least one semiconductor layer; and an electrically conductive contact layer at least partially filling the contact hole, the contact layer including a first layer made of a heavily doped polysilicon and a second layer disposed on the first layer and made of a metallic conductor.

In accordance with another feature of the invention, the contact layer includes a conductor layer between the layer made of polysilicon and the surface of the semiconductor structure in the contact hole. In other words, a thin, conductive layer is provided directly on the structure surface, which establishes an ohmic contact with the $n^+$-type and $p^+$-type zones in e.g. FET cells and also makes ohmic contact with the ($n^+$-type) polysilicon filling.

In accordance with a concomitant feature of the invention, a plurality of semiconductor regions are connected through the use of the contact hole. In particular, the semiconductor structure may be formed of a MOS-FET having a source region and a channel region which are both connected to one another and to the outside through the use of the contact layer according to the invention.

The advantage of the semiconductor structure produced by the method according to the invention is that additional processing of the contact hole such as beveling of the edges, is no longer necessary. Furthermore, the formation of shrink holes and cracking in the connecting conductor no longer occur. Moreover, better Na shielding of the component is afforded. When, as in the prior art, metal is used as the contact layer, Na atoms diffuse into the semiconductor structure. The Na atoms can then accumulate at the gate in the case of a MOS structure, and thus influence the threshold voltage of the transistor. Since Na diffuses into polysilicon to a very much lesser extent, making contact by using polysilicon thus forms an additional barrier to Na. Finally, the method according to the invention has the advantage of permitting additional processing steps for beveling the edges of the contact hole to be omitted.

Other features which are considered as characteristic for the invention are set forth in the appended claims.

Although the invention is illustrated and described herein as embodied in a method for making contact with a semiconductor layer and a semiconductor structure having a plurality of layers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
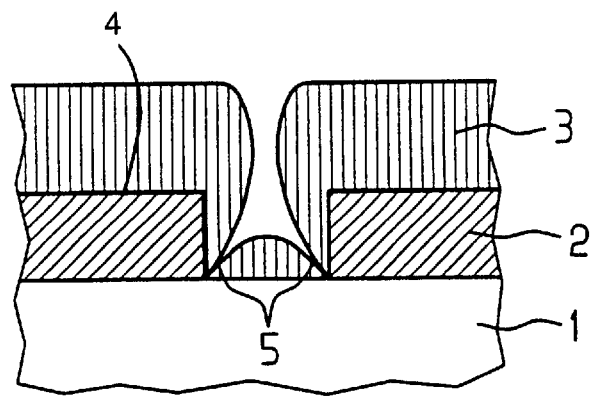
FIG. 2 is a fragmentary, cross-sectional view of a semiconductor structure having a contact hole with contact being made according to the prior art.

Referring now to the figures of the drawings in detail and first, particularly, to FIG. 2 thereof, there is seen a semiconductor component having a contact hole 4 with a rectangular cross-sectional profile. Variously doped non-illustrated active zones of the semiconductor component are situated in a bottom semiconductor substrate 1. An insulator layer 2 is applied over the semiconductor substrate 1 as an electrical insulation and in order to afford protection against chemical influences. The insulator layer is usually an oxide layer of the semiconductor material situated underneath. In other words, in the case of Si semiconductors, the insulator layer 2 is an $SiO_2$ layer in which the contact hole 4 is provided as a point of connection between the semiconductor and an electrical terminal. The insulator layer 2 is covered with an Al layer 3, with the result that the contact holes 4 are filled and electrical contact between one cell and another or to the outside is thus established.

However, due to surface tension of Al relative to e.g. $SiO_2$ as an insulator material, the covering of the insulator layer 2 with Al is not achieved easily, and constrictions 5 and breaks occur, as is illustrated in FIG. 2. In particular, making contact with MOS-FETs and IGBTs using aluminum is problematic when the contact holes have a relatively large depth in comparison with their diameter. Cracks arise in the Al if the contact holes are too small.

Figure 3:
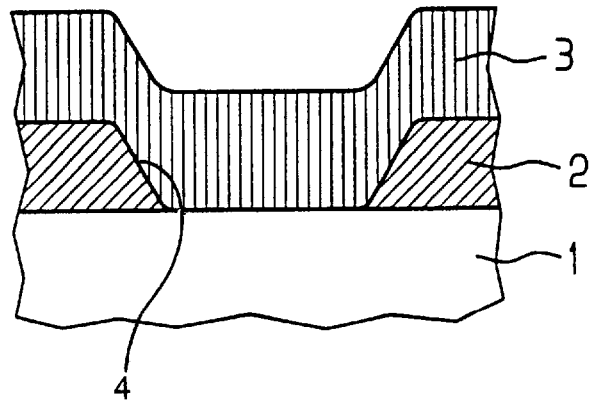
FIG. 3 is a fragmentary, cross-sectional view of a semiconductor structure having another contact hole with contact being made according to the prior art.

Those problems do not occur, or occur only to a lesser extent, in the case of contact holes with beveled side walls. A contact hole with beveled edges is illustrated in FIG. 3. As in the case of the prior art shown in FIG. 2, the non-illustrated active zones are situated in the semiconductor substrate 1. A contact hole 4 is again provided in the insulator layer 2 that is situated above the semiconductor substrate. However, in the case of the prior art shown in FIG. 3, the side walls of the contact hole are beveled, with the result that the cross section is no longer rectangular but trapezoidal instead. That has the advantage of causing the Al to cover a "smoother" surface and, therefore, constrictions of the Al as in FIG. 2 do not occur.

However, one disadvantage of that prior art is the greater space required by the contact hole on the semiconductor surface due to the beveled side walls, as well as the more complicated fabrication of beveled side walls.

Figure 1:
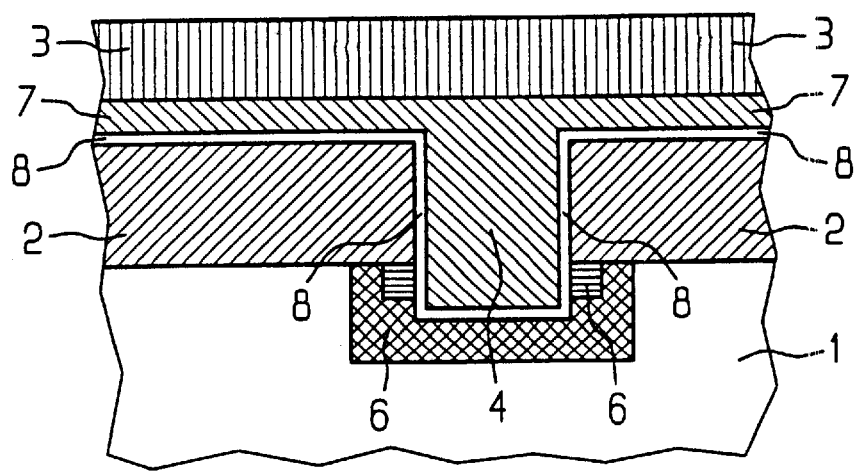
FIG. 1 is a fragmentary, diagrammatic, cross-sectional view of a semiconductor structure having a contact hole with a rectangular cross-sectional profile through which contact is made by the method according to the invention.

As in the case of the prior art according to FIGS. 2 and 3, the semiconductor structure shown in FIG. 1 has a semiconductor layer 1 or a semiconductor substrate as the bottommost layer, in which active zones 6 are situated. These active zones 6 serve for the actual switching of the semiconductor element and are correspondingly doped and shaped. Since the active zones do not contribute to the actual invention and have different properties depending on the desired component, they are not explained any further herein.

The semiconductor substrate 1 is covered by an insulator layer 2, which frequently involves an $SiO_2$ layer in the case of an Si semiconductor substrate. On one hand, this insulator layer 2 serves to protect the semiconductor substrate electrically, chemically and mechanically. On the other hand, electrical contacts with the active zones 6 in the semiconductor substrate have to be established through this insulator layer 2. For this purpose, contact holes 4 are provided which are filled with a conductive material.

According to the invention, the contact-making is established by heavily doped polysilicon. For this purpose, a polysilicon layer 7 is applied to the semiconductor structure having the insulator layer 2 and the contact holes 4 disposed therein. In order to ensure that the polysilicon has the lowest possible resistance, it is applied in heavily doped form as an $n^+$-type or $p^+$-type layer. In this case, the doping chosen for the polysilicon is the one which corresponds the best to that of the semiconductor layer with which contact is to be made. If, by way of example, it is desired to make contact with an active zone 6 which is n-doped, then the doping chosen for the polysilicon will likewise be n-type doping, and vice versa.

According to the invention, the polysilicon is applied to the entire surface of the semiconductor structure 1 in such a way that the contact hole 4 is completely filled. The contact hole 4 has an upper contact hole edge corresponding to the edge of the surface of the insulator layer 2. The contact hole 4 is filled with polysilicon at least up to that point.

A metal layer 3 is coated on the polysilicon layer 7. The metal layer can establish an electrical contact between the cell under consideration herein and the outside and, in particular, other cells on the same semiconductor substrate. In order to enable the polysilicon layer 7 to be metallized without the above-mentioned disadvantages of the prior art, the polysilicon layer 7 is polished. The methods that are suitable for this, such as CMP (chemical mechanical polishing), are generally known in the art and will not be explained in detail herein. It is preferable in this case for the polysilicon layer 7 to be removed down to the insulator layer 2, with the result that essentially only the contact hole 4 remains, which is filled with polysilicon, and a now smooth area has to be metallized.

As already mentioned, the doping of the polysilicon layer 7 will be chosen in dependence on the doping of the semiconductor substrate with which contact is to be made, or of the respective active zone 6 in the semiconductor. In the embodiment of a semiconductor component with which contact is made in the manner according to the invention, as illustrated in FIG. 1, a structure is shown which has a plurality of differently doped active zones 6 of the kind that are present in a MOS-FET, for instance. In order to eliminate a parasitic bipolar transistor in the MOS-FET structure, a number of differently doped zones 6 are also short-circuited to one another through a contact terminal for connection to the outside. In order to short circuit differently doped zones 6, it is preferable in this case to use metallization layers, in particular Ti/TiN double layers.

In one embodiment of the method according to the invention, such a conductor layer 8 is deposited prior to the application of the polysilicon on the surface of the semiconductor structure, at least in the region of the contact hole 4. As a result, a contact hole surface including a bottom area and a plurality of side areas is covered with a thin low-resistance conductor layer 8. This avoids instances of contact-making in which differently doped semiconductor materials abut one another.

The layers 7 and 3 are respective first and second layers of an electrically conductive contact layer at least partially filling the contact hole. The electrically conductive contact layer also includes the conductor layer 8.

Due to the high conductivity and the good contact-making properties of the polysilicon layer according to the invention, it is possible to fabricate very small contact holes 4, that is to say contact holes 4 with a relatively small diameter on the surface of the semiconductor structure. This is accomplished without the risk of defective contacts, since even relatively small irregularities such as shrink holes or constrictions in the polysilicon have no part to play in the electrical conduction due to the otherwise highly uniform structure of the electrical connection.

The essential features and advantages of the method according to the invention for making contact with a semiconductor and of a semiconductor according to the invention, can be summarized as follows: On the surface, the polysilicon layer is planarized by known methods and then the Al metal or other metallization layers are deposited. Since the contact holes do not cause constrictions in the Al, the homogeneity of the Al layer is good. The readily conductive layer may be composed e.g. of the barrier Ti/TiN used nowadays in CMOS technology, or a silicide such as WSi, PtSi, TaSi, TiSi, HfSi, etc. The metallization layer may be formed of Al, Al—Si, Al—Cu or Al—Ti—Ni—Ag. The contact hole may also be exclusively filled with a suitable silicide and subsequently planarized e.g. by CMP. This results in a layer which is impermeable to the penetration of alkali metal ions into the MOS system. The method is noncritical insofar as the polysilicon can also form cavities in the contact hole.

We claim:

1. In a method for making contact with at least one covered semiconductor layer through a contact hole, the improvement which comprises:

providing the at least one semiconductor layer;

covering the at least one semiconductor layer with an insulator layer having a surface;

producing the contact hole in the insulator layer for making contact with the at least one covered semiconductor layer;

producing a heavily doped polysilicon layer on the surface of the insulator layer while at least partially filling the contact hole with heavily doped polysilicon; and applying a metal layer on the heavily doped polysilicon layer for establishing an ohmic connection to the outside.

2. The method according to claim 1, which comprises polishing the surface of the polysilicon layer until substantially planar.

3. The method according to claim 1, which comprises selecting the polysilicon to be of the same conduction type as the at least one semiconductor layer with which contact is to be made.

4. The method according to claim 1, which comprises producing a conductor layer on a surface of the at least one semiconductor layer and on a surface defined by the contact hole prior to the production of the polysilicon layer.

5. The method according to claim 1, which comprises producing the contact hole without beveling sidewalls thereof.

6. A semiconductor structure having a plurality of layers, comprising:

at least one semiconductor layer for electrical connection to the outside;

an insulator layer disposed above said at least one semiconductor layer, said insulator layer having at least one contact hole formed therein for exposing said at least one semiconductor layer; and an electrically conductive contact layer at least partially filling said contact hole, said contact layer including a first layer made of a heavily doped polysilicon and a second layer disposed on said first layer and made of a metallic conductor.

7. The semiconductor structure according to claim 6, wherein said at least one semiconductor layer has a surface, and said contact layer includes a conductor layer disposed between said layer made of polysilicon and said surface of said at least one semiconductor structure in said contact hole.

8. The semiconductor structure according to claim 7, including a plurality of active zones connected by said contact hole.

9. The semiconductor structure according to claim 6, wherein said contact hole defines sidewalls in said insulator layer that are not beveled.

10. A MOSFET, comprising:

at least one semiconductor layer for electrical connection to the outside;

an insulator layer disposed above said at least one semiconductor layer, said insulator layer having at least one contact hole formed therein for exposing said at least one semiconductor layer; and an electrically conductive contact layer at least partially filling said contact hole, said contact layer including a first layer made of a heavily doped polysilicon and a second layer disposed on said first layer and made of a metallic conductor.

11. The MOSFET according to claim 10, wherein said contact hole defines sidewalls in said insulator layer that are not beveled.

* * * * *